United States Patent
Teng

(10) Patent No.: US 6,291,336 B1
(45) Date of Patent: Sep. 18, 2001

(54) ALCU METAL DEPOSITION FOR ROBUST RC VIA PERFORMANCE

(75) Inventor: Ming-Chang Teng, Hsin-Chu (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 722 days.

(21) Appl. No.: 08/879,477

(22) Filed: Jun. 20, 1997

Related U.S. Application Data

(63) Continuation of application No. 08/650,356, filed on May 20, 1996, now abandoned.

(51) Int. Cl.[7] .................................................. H01L 21/4763
(52) U.S. Cl. ..................... 438/627; 438/636; 438/677; 438/687
(58) Field of Search ........................... 438/688, 627, 438/660, 636, 677, 687

(56) References Cited

U.S. PATENT DOCUMENTS

| | | | |
|---|---|---|---|
| 5,106,781 | * 4/1992 | Penning De Vries | 437/190 |
| 5,108,951 | 4/1992 | Chen et al. | 437/187 |
| 5,266,521 | * 11/1993 | Lee et al. | 437/188 |
| 5,374,592 | * 12/1994 | MacNaughton et al. | 437/194 |
| 5,407,863 | 4/1995 | Katsura et al. | 437/197 |
| 5,427,666 | * 6/1995 | Mueller et al. | 204/192.17 |
| 5,523,259 | * 6/1996 | Merchant et al. | 437/190 |

OTHER PUBLICATIONS

S. Wolf, "Silicon Processing For The VLSI Era", vol. 2, 1992, Lattice Press, Sunset Beach, CA, pp. 131–133.

* cited by examiner

Primary Examiner—T. N. Quach
(74) Attorney, Agent, or Firm—George O. Saile; Stephen B. Ackerman; Sevgin Oktay

(57) ABSTRACT

A method for improving the electrical resistance of contacting surfaces in via holes in semiconductor substrates is disclosed. The via holes are formed and later filled with metal to interconnect metal layers in the substrate. The method involves the deposition of interconnect metal at two different stages of two different temperatures. In another embodiment, after sputter etch cleaning, one layer of specific thickness of interconnect metal is deposited at a specific temperature range.

22 Claims, 3 Drawing Sheets

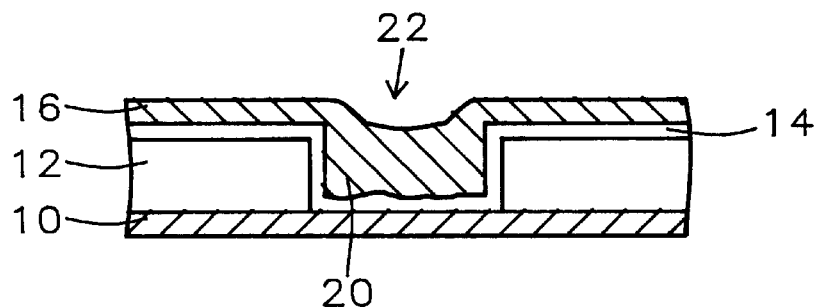
FIG. 1a - Prior Art
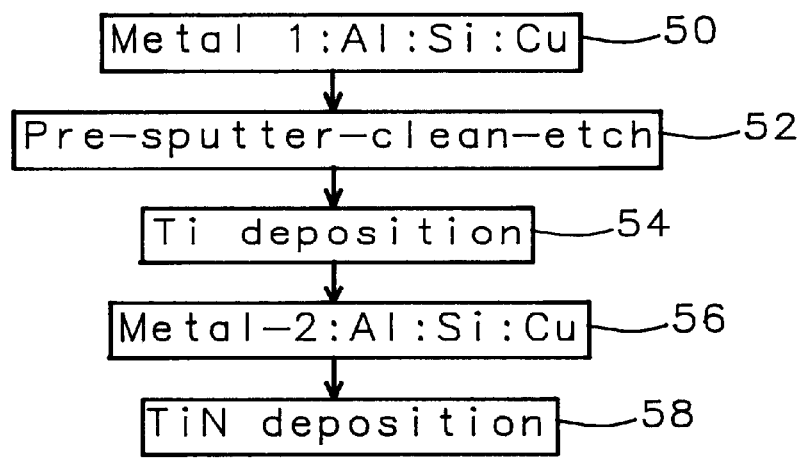
FIG. 1b - Prior Art

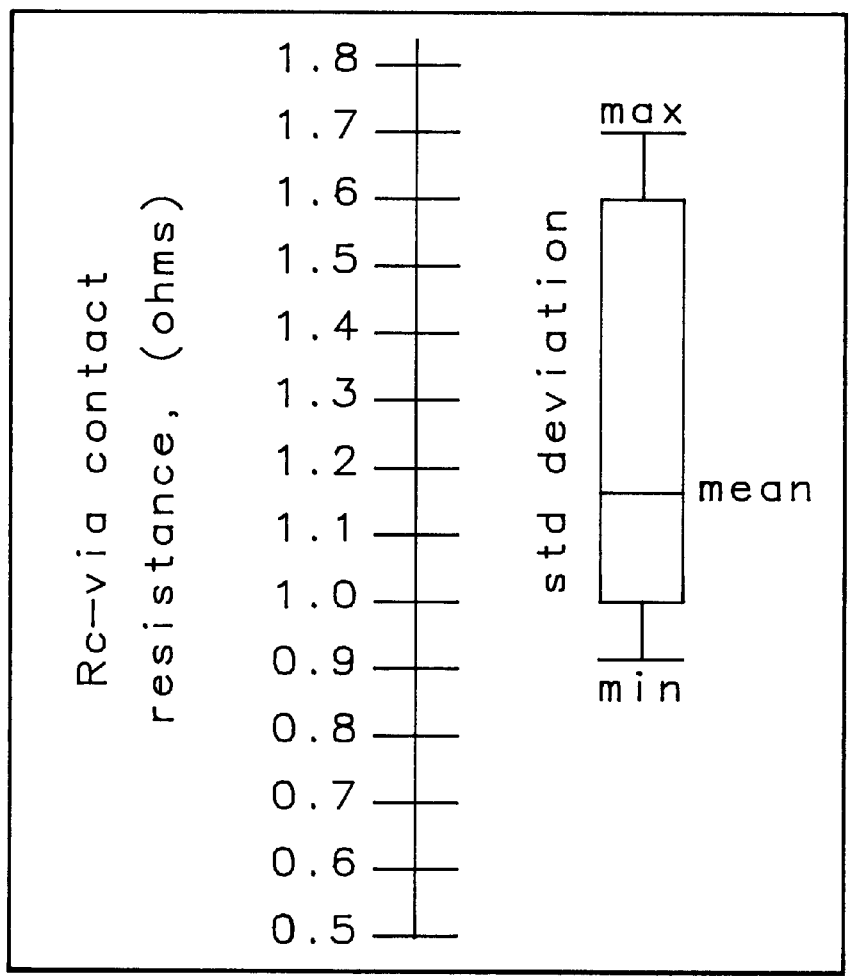
FIG. 1c – Prior Art
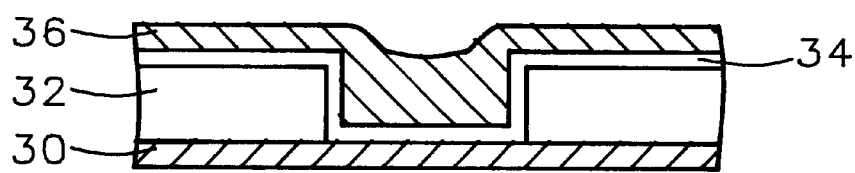
FIG. 2a

ALCU METAL DEPOSITION FOR ROBUST RC VIA PERFORMANCE

RELATED PATENT APPLICATION

U.S. patent application Ser. No. 08/595,704 filed Feb. 2, 1996 by the same inventor M. C. Teng entitled "A Method for Improved Aluminum-Copper Deposition and Robust Via Contact Resistance," assigned to common assignee now abandoned.

This application is a Continuation of application Ser. No. 08/650,356, filed May 20, 1996, now abandoned.

BACKGROUND OF THE INVENTION

(1) Field of the Invention

The present invention relates generally to semiconductors, and in particular, to a method of improving substantially the contact resistance of interconnect vias by means of stepwise deposition of metal at relatively low temperatures.

(2) Description of the Related Art

The performance of semiconductor integrated circuits is governed to a large extent by the electrical characteristics of its components. The components consist of electronic devices themselves where transistor action takes place, and the circuitry that connects the various components together. In the metal-oxide-semiconductors (MOS), the devices include the gate-source-drain, while in bipolars, the base-emitter-collector. The rest of the circuitry, namely, the micro-wires or the lines that connect the devices through various layers of the semiconductor are, for the most part, similar functionally and physically in both the MOS and bipolar technologies. Furthermore, the unit electrical resistance of the metal lines, or interconnects, are usually insignificant in comparison with the electrical resistance that is encountered at places where the lines make physical connection with each other or with the devices mentioned above. If the connection is to be made between components at different elevations, or levels, that are electrically insulated from each other within a semiconductor, then holes are formed in the insulators so that connections can be made through metal deposited into holes between the levels. Holes that reach over the devices that are normally at the lowest level are referred to as the "contact" holes. If, on the other hand, the holes are between the upper levels of the circuitry, those holes are referred to as the "via" holes. The metal that fills these holes are called the "contact-plug," and the "via-plug", respectively. It is the contact resistance that is offered to current flow at the interfaces between the "plugs" and the mating metal surfaces that governs, to a large extent, the performance of semiconductor integrated circuits.

The interconnections so formed through the "contact-plugs" or the "via-plugs" exhibit resistance (or impedance in the general case) to the flow of electric current through them. The nature of this electrical behavior can significantly impact the circuit performance of integrated circuits. Usually, the electrical resistance of the solid metal plugs themselves is small in comparison with the interfacial resistance that exists between the plugs and the contact surface that they are deposited on. When the contact surface is the silicon (Si) substrate, the interfacial or the contact resistance, $R_{cs}$, becomes a part of a parasitic resistance, $R_p$, that exists in the path between the metal plug-to-Si substrate interface and the region in the device where the actual transistor action begins. The various other resistances within the devices themselves that contribute to the total $R_p$ are well known and as they are not significant to the invention, will not be described in detail here. It is also known that the contribution of the contact resistance $R_{cs}$ of the metal-Si interface can be significant and that many methods have been devised to reduce its contribution to the over-all resistance, $R_p$. It is of interest to note that a similar contact resistance, $R_{cm}$, but at a metal-to-metal interface, exists with the "via-plugs" that connect the upper level metals in the upper interconnect layers. While many methods are available for improving the integrity of the metal-Si contact interface, as noted above, few exist for metal-metal interfaces in the via-plugs, which is the main concern of the present invention.

It will be appreciated in general that the via-plugs that connect one layer of metal lines with another at another level in a semiconductor substrate must be of good quality. That is, the metal must have good physical properties, it must fill the hole well, and most importantly, must form a good interfacial contact with the metal lines that it is connecting together. Because of its properties, aluminum (Al) is well suited for fabrication of metal interconnect lines. However, one major limitation has been the formation of hillocks at relatively low processing temperatures above 300° C. As is well known in the art, hillocks are spike-like projections that erupt in response to a state of compressive stress in metal films and consequently protrude from the film's surface. When the protrusions penetrate the dielectric layer that separates the neighboring metal lines, they can cause inter-level shorting. Hillocks arise as a consequence of the low melting point of Al (660° C.) which promotes high rate of vacancy diffusion in Al films. To inhibit vacancy diffusion through the grain boundaries, elements are usually added in excess of the solid solubility limit in the aluminum, thereby causing the elements to precipitate out and "plug" the grain boundaries. Both copper (Cu) and silicon (Si) are used for this purpose to form Al:Si:Cu, or Al:Cu films, but copper has been found to be more effective in this application.

It has also been found in the practice of the present invention that Al:Cu films perform substantially better than Al:Si:Cu films in relation to contact resistance in the via holes. It is because, a second factor is involved in the formation of surface protuberances such as hillocks at interfaces between metal and silicon, or even between contacting metal surfaces themselves. When the thermal coefficient of expansion of two neighboring materials are significantly different, such as that of Al ($23.5 \times 10^{-6}$/° C.) and Si ($2.5 \times 10^{-6}$/° C.), then, when the substrate is heated, a compressive stress develops which in turn causes nodules of metal to dislodge from the film and form an irregular interface. This is illustrated in FIG. 1a where a rough interface (20) is depicted at the bottom of the via plug (22). In the underlying process of FIG. 1a, an insulating layer (12), such as a reflow glass or other oxide layer as known in the art, is formed over a metal-1 layer (10), such as Al:Si:Cu, on a substrate. A via hole is opened through the oxide layer (12) using a mask and a conventional isotropic etching technique until metal-1 is reached. Then, a barrier metal (14), such as a refractory metal, metal nitride, metal silicide, or combination thereof, is deposited over the surface of the substrate. Layer (14) is deposited conformally to cover the bottom and sidewalls of the via hole. When metal-2 (16) is deposited subsequently, especially Al:Si:Cu, without stepwise staging, and/or at unfavorable substrate temperatures as described below, then poor interface (20) is formed between the via-plug (22) and the underlying metal layer (10), thus giving rise to poor contact resistance.

The problems cited above are exacerbated by the advent of the submicron semiconductor technology because of the smaller geometries. The smaller via holes tend to have a larger aspect ratio (height to width ratio) thereby making it more difficult to fill the holes with the attendant magnification of the poor contact resistance problem. It will be appreciated that the contact resistance is a function of the area at the bottom of the via hole. Sloped sidewalls that were used to improve metal flow into the vias with larger geometry devices are now becoming a liability as device sizes shrink because they consume too much area on a semiconductor chip. Consequently, attention is turning more and more to the metallurgical as well electrical properties of the metal itself. For example, refractory metal is being used in the vias in conjunction with the aluminum interconnect layer to improve the electrical conduction through the via. Some other metals used include titanium (Ti), titanium-tungsten (Ti:W), chemical vapor deposited tungsten (CVD W), and polycrystalline silicon (polySi), thus forming the structures Al—Ti—Si, Al—Ti:W—Si, Al—CVD W—Si and Al—polySi—Si, respectively. Even more complex multilayered structures are used as discussed in S. Wolf, "Silicon Processing for the VLSI Era," vol.2, Lattice Press, Sunset Beach, Calif., 1990, pp. 131–133. where platinum-silicide (PtSi) and titanium-nitride (TiN), for example, are sandwiched to form Al—Ti:W—PtSi—Si and Al—TiN—Ti—Si contact metallurgies. The methods by which these structures are processed (e.g., sputtering, evaporating, etc.,) are well known in the art and as they are not significant to the invention, will not be described in detail here.

Still, aluminum and aluminum alloys are the most common interconnect metals that are used in silicon substrates today. Of the problems associated with depositing aluminum in via holes, there is also the formation of voids which in turn can cause high via resistance. U.S. Pat. No. 5,108,951 addresses the problem from the point of view of the temperature at which aluminum is deposited into the vias. It is claimed in said Patent that voids form in the vias because aluminum is deposited at a temperature which tends to encourage fairly large grain sizes. Therefore, it is proposed in the same Patent that the aluminum be deposited by heating the substrate to a temperature between about 380° C. to 500° C. where the lower the deposition temperature, the smaller is the grain size. In another U.S. Pat. No. 5,407,863, the temperature range from the initial stage of aluminum deposition to the final stage is in between about 180° C. to 460° C. However, the metal film is formed while the temperature is changed at least twice during deposition. In this manner, the grain sizes of each layer of metal film formed at a temperature level is different from the grain sizes formed at the next temperature level. Consequently, layers of metal film having different crystal grain sizes are laminated stepwise in such a way that the grain boundaries are not likely to align themselves in the direction of the film thickness to form a void. Here, the thickness of the respective films is controlled by controlling the amount of aluminum or aluminum alloy that is deposited, which in turn is controlled by the speed at which the deposition is accomplished. Since metal film is formed by the well-known sputtering process, it is possible to change the film forming speed by changing the speed or density of ions generated in argon (Ar) gas and collided against an aluminum (Al) target.

It will be noted that the techniques that are proposed in U.S. Pat. Nos. 5,108,951 and 5,407,863 are directed towards solving the problems of void formation in via holes and electromigration or stress migration in Al or Al alloy films, respectively. It will also be known to those in the art that there are competing mechanisms between lowering the metal deposition temperature so as to reduce the grain size on the one hand, and increasing the temperature to aid the flow of melt into the holes on the other. Also the speed of deposition enters into the picture, because proper adjustments must be made as a function of temperature so as to allow sufficient time for the melt to form at that temperature and flow without bridging, for example, at the mouth of the via hole. It is proposed in the present invention, a method whereby the variables involving temperatures, materials and deposition rates are formulated in such a way that the electrical integrity of the via-plugs in the via holes is further improved over prior art.

A still further requirement beyond attaining a physically and electrically sound (no voids, low bulk resistance) via-plug is good interfacial contact (contact resistance) between the plug and the metal interconnect lines. The integrity and characteristics of a metal-to-metal contact is determined by the processes and the materials used in forming the contact. One of the important steps in the basic process of forming contact is the preparation of the surface (metal-1 in (step 50) of FIG. 1*b*) prior to the deposition of metal-2 (step 56) into the via hole. For this purpose, a pre-sputter etch cleaning is used to remove native oxide layers in the via hole. This is shown as (step 52) of prior art FIG. 1*b*. In order to provide a good metallurgical as well as mechanically locking interface between the via-plug and the next level metal, titanium (Ti) is deposited conformally into the via hole, which is (step 54) It is further proposed in this invention that the second metal be deposited at least two different temperatures in order to improve the electrical resistance of the total via-plug including the contact resistance described before.

SUMMARY OF THE INVENTION

It is therefore an object of this invention to formulate a metal deposition process for the purpose of reducing the electrical resistance of via-plugs in semiconductor substrates.

It is a further object of this invention to provide a method for reducing the electrical resistance of contacting surfaces in via holes.

It is still another object of this invention to provide a via-plug structure with a robust electrical performance.

These objectives are accomplished by first forming via holes in the oxide that covers the first level metal on a substrate. The metal exposed in the holes is then sputter etch cleaned. Titanium is next sputter deposited into the holes to provide good wettability at the interface between the first metal and the second metal to be deposited next. First layer of the second metal, namely, aluminum-copper, is sputter deposited at a temperature between about 40° C. to 80° C., followed by a second layer of the same second metal, but at a high temperature of between about 240° C. and 280° C. The process is completed by the deposition of an anti-reflective coating (ARC), preferably titanium nitride (TiN), to facilitate the subsequent photolithographic processes as conventionally practiced in the manufacturing of semiconductor substrates. In another embodiment, after sputter etch cleaning, a single layer of interconnect metal of thickness between about 6,000 to 6,600 Å is deposited at a lower temperature range between about 40 to 80° C.

BRIEF DESCRIPTION OF THE DRAWINGS

FIG. 1*a*. is a cross-section of a prior art semiconductor substrate showing two levels of metal layers connected with a via-plug containing a void.

FIG. 1*b*. is a process flow for prior art metal deposition.

FIG. 1c. is a plot of prior art via contact resistance.

FIG. 2a. is a cross-section of a semiconductor substrate showing two levels of metal layers connected with a via-plug according to this invention.

DESCRIPTION OF THE PREFERRED EMBODIMENTS

Figure 2B:
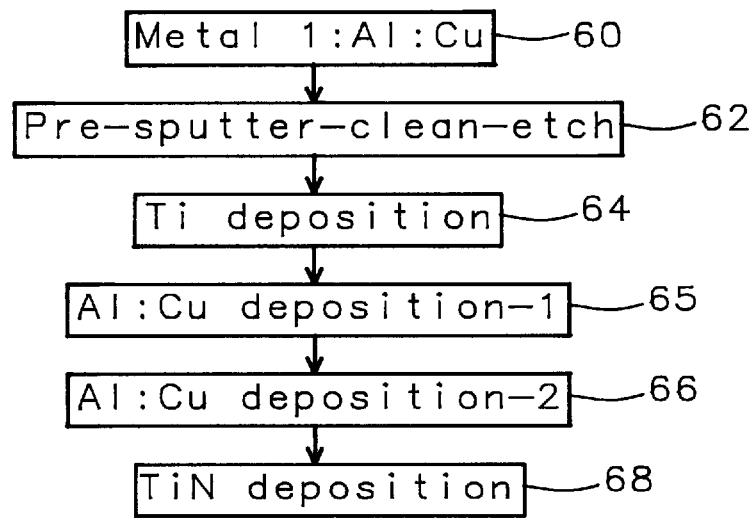
FIG. 2b. is a process flow for metal deposition according to this invention.
Figure 2C:
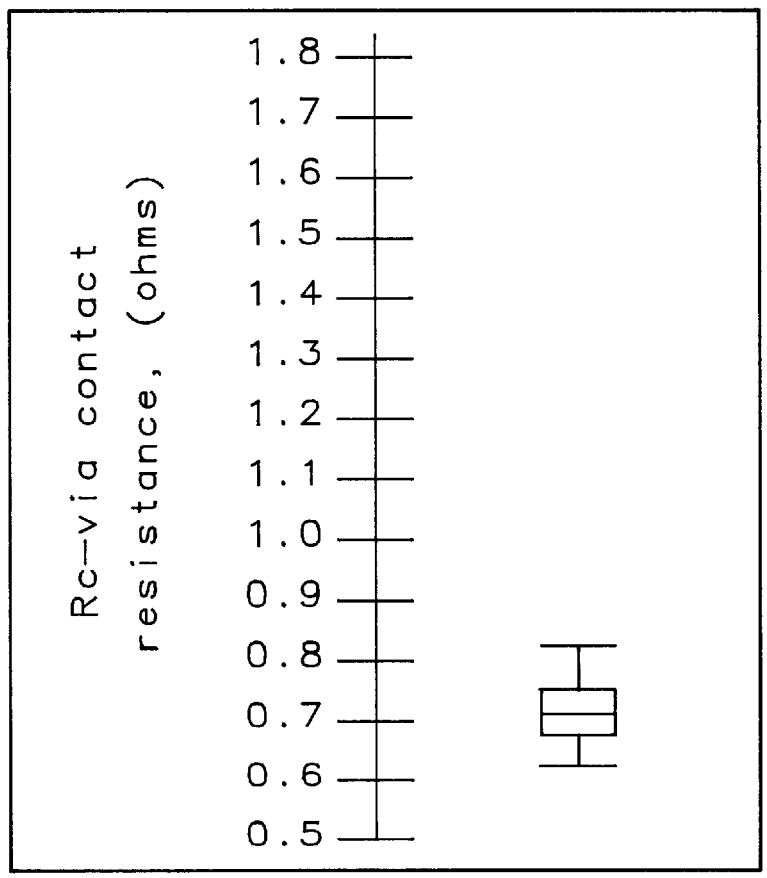
FIG. 2c. is a plot of via contact resistance according to this invention.

Referring now to the drawings, more particularly to FIGS. 2a through 2c, there is illustrated a method for improving the electrical performance of via-plugs formed in semiconductor devices. In FIG. 2a, a first metal layer (30), which is deposited on a substrate, is separated from an upper second metal layer (36) by an intervening insulating layer (32). Layer (32) is an oxide layer as known in the art, and has a thickness of between about 5000 Angstroms (Å) to 10,000 Å. A via hole is opened through the oxide layer (32) using a mask and a conventional isotropic etching technique until metal-1 is reached. Then, following a pre-sputter etch cleaning of the hole, titanium (34) is deposited over the surface of the substrate. Layer (34) is deposited conformally to cover the bottom and sidewalls of the via hole. When metal-2 (36) is deposited subsequently, following the process steps of (65) and (66) shown in FIG. 2b, the layer (36) establishes a good interface (38) as shown in FIG. 2a. This is in contrast with the via hole of the prior art shown in FIG. 1a, where usually an irregular surface occurs as explained before.

In the present invention, the preferred metal is aluminum-copper (Al:Cu) as the interconnect metal throughout. (Copper is added to aluminum to alleviate the problems of electromigration and hillock formations, and the alloy is sputtered rather than evaporated for better control of the alloy composition, which are not described here). The use of Al:Cu as interconnect metal is well known in prior art. In step 56 of FIG. 1b of prior art, for example, Metal-2 is also Al:Cu. However, it is found in practice of manufacturing that when Al:Cu is deposited at one temperature, usually around 300° C., the resulting process yields a measured via-plug electrical resistance of a mean value of 1.20Ω with a standard deviation of 0.6Ω. As shown in FIG. 1c. In contrast, the electrical resistance obtained following the two-step process of the present invention, it is seen in FIG. 2c that the mean resistance is substantially reduced to 0.70Ω with a tighter standard deviation of 0.06Ω. The preferred conditions for the two-step process (steps 65 and 66) in FIG. 2b are as follows:

TABLE I

| Parameters | step 65 FIG. 2b (initial deposition stage) | step 66 of FIG. 2b (final deposition stage) |
| --- | --- | --- |
| Metal | Al:Cu | Al:Cu |
| Temperature | 40° C.–80° C. | 240° C. to 280° C. |
| Depost. rate | 200 Å/sec | 200 Å/sec |
| Film thickness | 2,000 Å–2,200 Å | 4,000 Å–4,400 Å |
| film strcuture | Ti + Al:Cu | Ti + Al:Cu |

Thus, while the steps of 60, 62 64, and 68 of FIG. 2b of the present invention are similar to the corresponding steps of 50, 52, 54, and 58 in FIG. 1b of prior art, new steps of 65 and 66 are disclosed wherein the preferred embodiments are shown in Table I above. The correspondingly improved results are given in FIG. 2c.

In the description above, numerous details were set forth, such as specific materials, process parameters, etc., in order to provide a thorough understanding of the present invention. It will be obvious. However, to those skilled in the art that these specific details need not be employed to practice the present invention. For example, only a single deposition of Al/Cu may be preferred, but near room temperature in between about 40° C. to 80° C. to minimize aluminum grain sizes. At this lower temperature range, preferred metal thickness is between about 6,000 to 6,600 Å. Also, in the earlier embodiment of the two metal layer deposition, it is preferred to stop the metal deposition when changing temperatures in going from one stage to another. In still another embodiment, the deposition may be made continuously while changing temperatures. Finally, the ramp time for changing temperature can be varied between about 7 to 13 seconds.

That is to say, while the invention has been particularly shown and described with reference to the preferred embodiments thereof, it will be understood by those skilled in the art that various changes in form and details may be made without departing from the spirit and scope of the invention. For instance, the same procedures described here for MOS fabrication are just as applicable to the fabrication of bipolar semiconductors.

What is claimed is:

1. A method of depositing a metal layer on a semiconductor substrate comprising the steps of:

providing a silicon substrate having a first metal layer;

depositing an insulating layer over said metal layer;

forming via holes therein said insulating layer;

performing a sputter etch cleaning of said via holes;

depositing a barrier layer in said via holes;

depositing a film of second metal over said barrier layer, wherein said second metal is aluminum copper alloy, wherein said second metal is deposited at a temperature between about 40° C. to 80° C., and wherein the thickness of said second metal is between about 6,000 to 6,600 Å; and depositing an anti-reflective coating onto said film of metal.

2. The method of claim 1, wherein said first metal layer is an aluminum copper alloy.

3. The method of claim 1, wherein said insulating layer is planarized oxide.

4. The method of claim 3, wherein the thickness of said planarized oxide layer is between about 5,000 Å to 10,000 Å.

5. The method of claim 4, wherein said insulating layer is dry-etched to form via holes.

6. The method of claim 1, wherein said sputter etch cleaning is performed with argon gas.

7. The method of claim 1, wherein said barrier layer is titanium.

8. The method of claim 7, wherein the thickness of said is between about 1,000 to 2,000 Angstroms.

9. The method of claim 1, wherein said anti-reflective coating is titanium nitride.

10. The method of claim 9, wherein the thickness of said is between about 200 to 300 Angstroms.

11. A method of depositing a metal layer on a semiconductor substrate comprising the steps of:

providing a silicon substrate having a first metal layer;

depositing an insulating layer over said metal layer;

forming via holes therein said insulating layer;

performing a sputter etch cleaning of said via holes;

depositing a barrier layer in said via holes;

depositing a first film of second metal over said barrier layer, wherein said first film of second metal is aluminum copper alloy, wherein said first film of second metal is deposited at a temperature between about 40° C. to 80° C.;

depositing a second film of second metal over said barrier layer, wherein said second film of second metal is aluminum copper alloy, wherein said second film of second metal is deposited at a temperature between about 240° C. to 280° C.; and depositing an anti-reflective coating onto said film of metal.

12. The method of claim 11, wherein said first metal layer is an aluminum copper alloy.

13. The method of claim 11, wherein said insulating layer is planarized oxide.

14. The method of claim 13, wherein the thickness of said planarized oxide layer is between about 5,000 Å to 10,000 Å.

15. The method of claim 14, wherein said planarized oxide layer is dry-etched to form via holes.

16. The method of claim 11, wherein said sputter etch cleaning is performed with argon gas.

17. The method of claim 11, wherein said barrier layer is titanium.

18. The method of claim 17, wherein the thickness of said titanium is between about 1,000 to 2,000 Angstroms.

19. The method of claim 11, wherein the thickness of said first film of second metal is between about 2,000 Å to 2,200 Å.

20. The method of claim 11, wherein the thickness of said second film of second metal is between about 4,000 Å to 4,400 Å.

21. The method of claim 11, wherein said ARC is titanium nitride.

22. The method of claim 21, wherein the thickness of said titanium nitride is between about 200 to 300 Angstroms.

* * * * *